United States Patent
Sakai et al.

(10) Patent No.: US 7,713,582 B2
(45) Date of Patent: May 11, 2010

(54) SUBSTRATE PROCESSING METHOD FOR FILM FORMATION

(75) Inventors: Masanori Sakai, Takaoka (JP); Toru Kagaya, Toyama (JP); Nobuhito Shima, Imizu (JP)

(73) Assignee: Hitachi Kokusai Electric, Tokyo (JP)

( * ) Notice: Subject to any disclaimer, the term of this patent is extended or adjusted under 35 U.S.C. 154(b) by 43 days.

(21) Appl. No.: 12/039,686

(22) Filed: Feb. 28, 2008

(65) Prior Publication Data

US 2008/0160214 A1 Jul. 3, 2008

Related U.S. Application Data

(62) Division of application No. 10/530,527, filed on Dec. 16, 2005, now abandoned.

(51) Int. Cl.
*C23C 16/455* (2006.01)

(52) U.S. Cl. ............... 427/248.1; 427/569; 117/84; 117/103

(58) Field of Classification Search ............ 427/248.1, 427/569; 117/84, 103
See application file for complete search history.

(56) References Cited

U.S. PATENT DOCUMENTS

| | | | | |
|---|---|---|---|---|
| 5,955,037 | A * | 9/1999 | Holst et al. | 422/171 |
| 6,174,377 | B1 * | 1/2001 | Doering et al. | 118/729 |
| 6,182,603 | B1 | 2/2001 | Shang et al. | |
| 6,231,672 | B1 | 5/2001 | Choi et al. | |
| 6,328,864 | B1 | 12/2001 | Ishizawa et al. | |
| 6,579,372 | B2 * | 6/2003 | Park | 118/715 |
| 6,605,134 | B2 | 8/2003 | Ishihara et al. | |
| 6,656,282 | B2 * | 12/2003 | Kim et al. | 118/695 |
| 6,905,547 | B1 * | 6/2005 | Londergan et al. | 118/715 |
| 6,915,592 | B2 * | 7/2005 | Guenther | 34/582 |
| 7,141,095 | B2 * | 11/2006 | Aitchison et al. | 95/273 |
| 7,335,396 | B2 * | 2/2008 | Carpenter et al. | 427/248.1 |
| 7,485,338 | B2 * | 2/2009 | Faguet | 427/248.1 |
| 2001/0054377 | A1 * | 12/2001 | Lindfors et al. | 117/104 |
| 2002/0033229 | A1 | 3/2002 | Lebouitz et al. | |
| 2002/0100418 | A1 * | 8/2002 | Sandhu et al. | 118/719 |
| 2003/0123216 | A1 * | 7/2003 | Yoon et al. | 361/303 |
| 2004/0107897 | A1 * | 6/2004 | Lee et al. | 117/200 |
| 2004/0126485 | A1 * | 7/2004 | Thompson et al. | 427/126.5 |
| 2005/0022735 | A1 * | 2/2005 | Breitung et al. | 118/715 |
| 2005/0223982 | A1 * | 10/2005 | Park et al. | 118/715 |
| 2006/0032444 | A1 * | 2/2006 | Hara | 118/715 |

FOREIGN PATENT DOCUMENTS

| | | | |
|---|---|---|---|
| JP | 62-106627 | A | 5/1987 |
| JP | 1-296613 | A | 11/1989 |
| JP | 2-199820 | A | 8/1990 |
| JP | 5-206036 | A | 8/1993 |
| JP | 6-45256 | A | 2/1994 |
| JP | 7-176519 | A | 7/1995 |
| JP | 7-325279 | A | 12/1995 |
| JP | 11-87341 | A | 3/1999 |
| JP | 2003-071270 | A | 3/2003 |
| JP | 2003-218106 | A | 7/2003 |
| JP | 2003-297818 | A | 10/2003 |

OTHER PUBLICATIONS

Yang, Taek Seung, et al., "Atomic layer deposition of nickel oxide films using Ni(dmamp)2 and water". J. Vac. Sci. Technol. A 23(4), Jul./Aug. 2005, pp. 1238-1243.*
Elam, J.W., et al., "Atomic layer deposition of palladium films on Al2O3 surfaces". Thin Solid Films 515 (2006) pp. 1664-1673.*

* cited by examiner

*Primary Examiner*—Bret Chen
(74) *Attorney, Agent, or Firm*—Birch, Stewart, Kolasch & Birch, LLP

(57) ABSTRACT

A film-forming method that includes providing a substrate to be film-formed in a reaction chamber of an apparatus that includes: the reaction chamber; a first gas supply pipe in fluid communication with the reaction chamber for carrying a first processing gas to the reaction chamber; a second gas supply pipe in fluid communication with the reaction chamber for carrying a second processing gas to the reaction chamber; a gas reservoir in fluid communication with the first gas supply pipe; and a bypass line in fluid communication with the first gas supply pipe, the bypass line bypassing the gas reservoir; and the steps of alternately supplying the first processing gas and the second processing gas into the reaction chamber a plurality of times to form a film on the substrate, and wherein when the first gas is supplied, the gas reservoir or the bypass line is selected to supply the first gas into the reaction chamber through the first gas supply pipe, and when the second gas is supplied the second gas is supplied through the second gas supply pipe.

11 Claims, 5 Drawing Sheets

FIG.3A
FIG.3B
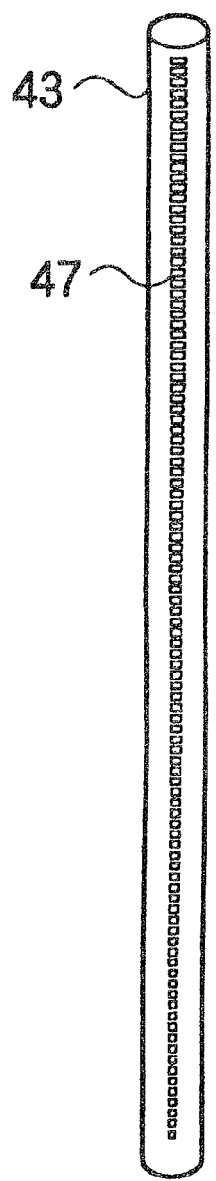
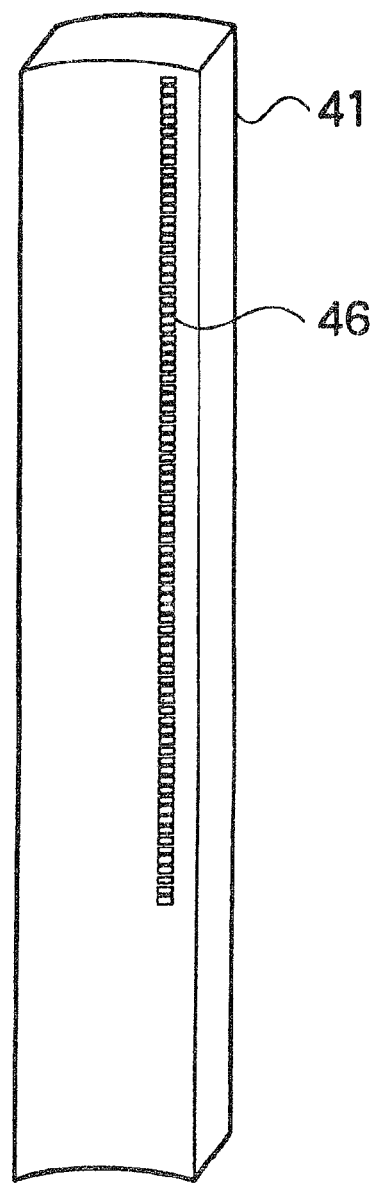

FIG.4
1st cycle
2nd cycle
3rd cycle
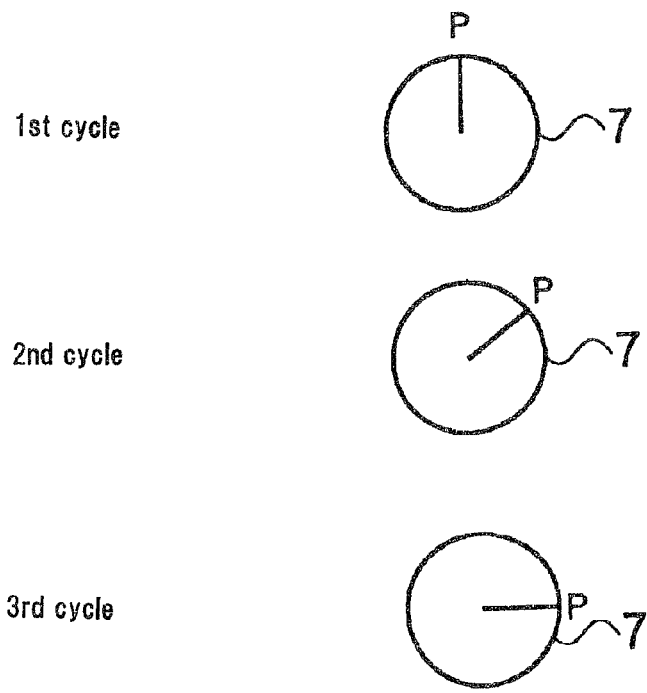
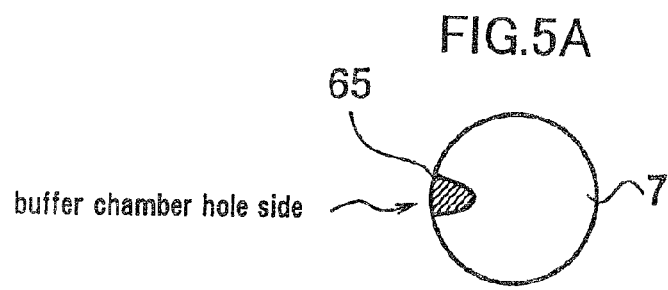
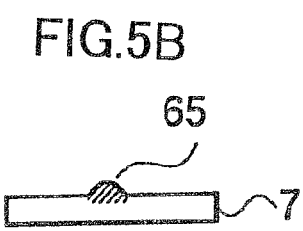

SUBSTRATE PROCESSING METHOD FOR FILM FORMATION

This application is a Divisional of co-pending application Ser. No. 10/530,527 filed on Dec. 16, 2005 now abandoned, and for which priority is claimed under 35 U.S.C. §120; and this application claims priority of Application No. JP 2002-295323 filed in Japan on Oct. 8, 2002 under 35 U.S.C. 119; the entire contents of all are hereby incorporated by reference.

TECHNICAL FIELD

The present invention relates to a substrate processing apparatus, and more particularly, to a substrate processing apparatus in which a gas supply structure for supplying gas which contributes to film formation is improved.

BACKGROUND ART

As an example of a process processing of a substrate, a substrate processing apparatus which carries out film form processing using an ALD (Atomic Layer Deposition) method is known. According to this substrate processing apparatus, two (or more) kinds of raw material gases used for forming a film are alternately supplied onto a substrate in a reaction chamber one kind by one kind, the gases adsorb on the substrate one atom layer by one atom layer, and a film is formed utilizing only surface reaction. In this case, the gas supply amount of the raw material gas is controlled in flow rate by a mass flow controller (MFC) provided in a gas supply pipe.

When a film is allowed to grow on a substrate by subjecting a substrate to alternative surface reaction of vapor phase reacting materials, the faster the adsorption of the raw material gases to the substrate surface is, the shorter the time required for forming a film becomes, and the productivity is enhanced. Generally, the absorption amount is proportional to pressure×time. When an amount corresponding to the pressure×time is defined as L, if L is constant and the pressure is higher, the same amount of gas can adsorb even if the time is shorter. That is, if the pressure in the reaction chamber is rapidly increased, the raw material gas can adsorb in a short time.

Thus, in order to increase the pressure in the reaction chamber, it is necessary to supply the raw material rapidly. Normally, an MFC is used for supplying raw material gas, but since the maximum flow rate of MFC is limited, the supply speed is limited.

For this reason, it is proposed that a gas supply pipe located downstream from the MFC is provide with a gas reservoir for storing raw material gas therein.

FIG. 6 shows an example in which a gas supply pipe is provided with a gas reservoir.

As shown in FIG. 6, the gas supply pipe 51 is provided with first and second opening/closing valves 1 and 2 in front of and behind the gas reservoir 10. When raw material gas is to be supplied, the first valve 1 located between an MFC 27 and the gas reservoir 10 is opened, the raw material gas is once stored in the gas reservoir 10 and then, the second valve 2 located between the gas reservoir 10 and the reaction tube 6 which is a reaction chamber is opened. There exist only the pipe 51 and the opened second valve 2 between the gas reservoir 10 and the reaction tube 6, and in the conventional supply method using the MFC 27, there also exist the MFC 27 and the long 51 and thus, conductance of the path becomes great, and the supply speed is increased. This will be explained using an expression. The relational expression between supply speed, conductance and pressure is $Q=C\times(P1-P2)$. Here, Q represents supply speed ($Pa\cdot m^3/sec$), C represents conductance ($m^3/sec$), and P1 and P2 represent pressures (Pa) in front of and behind the pipe.

Thus, if the conductance of the path is increased, the supply speed is also increased, and the raw material gas can adsorb in a short time. That is, if the gas supply pipe is provided with the gas reservoir for storing the raw material gas, the supply speed of the raw material gas to be supplied into the reaction chamber can be increased. Thus, the raw material gas can absorb in a short time, and the film forming time can be shortened.

According to the substrate processing apparatus using the ALD method, a plurality of kinds, e.g., two kinds of reaction gases are alternately supplied onto a substrate one kind by one kind, the gases are allowed to adsorb on the substrate one atom layer by one atom layer, and a film is formed utilizing the surface reaction. This step is defined as one cycle. The thickness of the film is controlled by the number of cycles of the supply of the reaction gas. For example, when the film forming speed is defined as 1 Å/cycle, in order to form a film of 500 Å film, the processing is carried out by 500 cycles. That is, an extremely thin film is formed through one cycle, a predetermined cycles is repeated to obtain a desired thickness.

The raw material gas is once stored in the gas reservoir, and the raw material gas is supplied onto the substrate from the gas reservoir at higher supply speed. For example, if one kind of raw material gas is supplied onto the substrate from a supply port of that raw material gas along a radial direction of the substrate, a film thickness of the substrate closer to the supply port of the raw material gas becomes thick, the thickness of the film is locally increased, and there is an adverse possibility that only one location of the periphery is convexed. In the next cycle, if the gases are supplied at higher supply speed from the gas reservoir using the gas reservoir, a film is formed on a portion of the substrate other than the locally thick portion (convexed portion). Thus, if the number of cycles is 500, the locally thickened portion is dispersed, and the film thickness is equalized. When a thin film is to be formed, however, if the number of cycles is less than 60, the dispersion of the locally thickened portion is inferior, i.e., the film forming operation is finished before the locally thickened portion is dispersed, and the periphery becomes uneven and the consistency of the film thickness is deteriorated in some cases.

Therefore, it is a main object of the present invention is to provide a substrate processing apparatus capable of achieving excellent consistency of film thickness when a thin film is formed.

DISCLOSURE OF THE INVENTION

According to a preferable aspect of the present invention, there is provided a substrate processing apparatus, comprising: a reaction chamber forming a space in which a substrate is to be processed, a gas supply pipe which is connected to said reaction chamber and which supplies processing gas for said substrate, and a gas exhaust pipe for exhausting an inside of said reaction chamber, wherein a gas reservoir for storing gas to be supplied to said reaction chamber and a bypass line which bypasses said gas reservoir are juxtaposed to each other in a portion of said gas supply pipe, and said substrate processing apparatus further comprises a control unit which allows the processing gas to be supplied to said reaction chamber using one of said gas reservoir and said bypass line when said substrate is processed.

With this structure, if the processing gas is supplied to the reaction chamber using the bypass line without using the gas reservoir, the processing gas is not abruptly supplied to the reaction chamber, the gas is sufficiently dispersed and thus, the consistency of film thickness becomes excellent. Therefore, if the bypass line is used when a thin film is formed, a film having equalized or constant thickness can be formed even if its thickness is thin.

BRIEF DESCRIPTION OF THE FIGURES IN THE DRAWINGS

FIGS. 3A and 3B are perspective view showing one example of a nozzle and gas holes of a second buffer chamber.

FIG. 4 show a relation between a substrate and a supply position of gas.

FIGS. 5A and 5B show a state of a substrate, wherein FIG. 5A is a plan view and FIG. 5B is a side view.

PREFERABLE MODE FOR CARRYING OUT THE INVENTION

Next, a preferable embodiment of the present invention will be explained with reference to the drawings.

As an example of a process processing for substrates carried out in a preferred embodiment of the present invention, film forming processing using an ALD (Atomic Layer Deposition) method will be explained.

Figure 1:
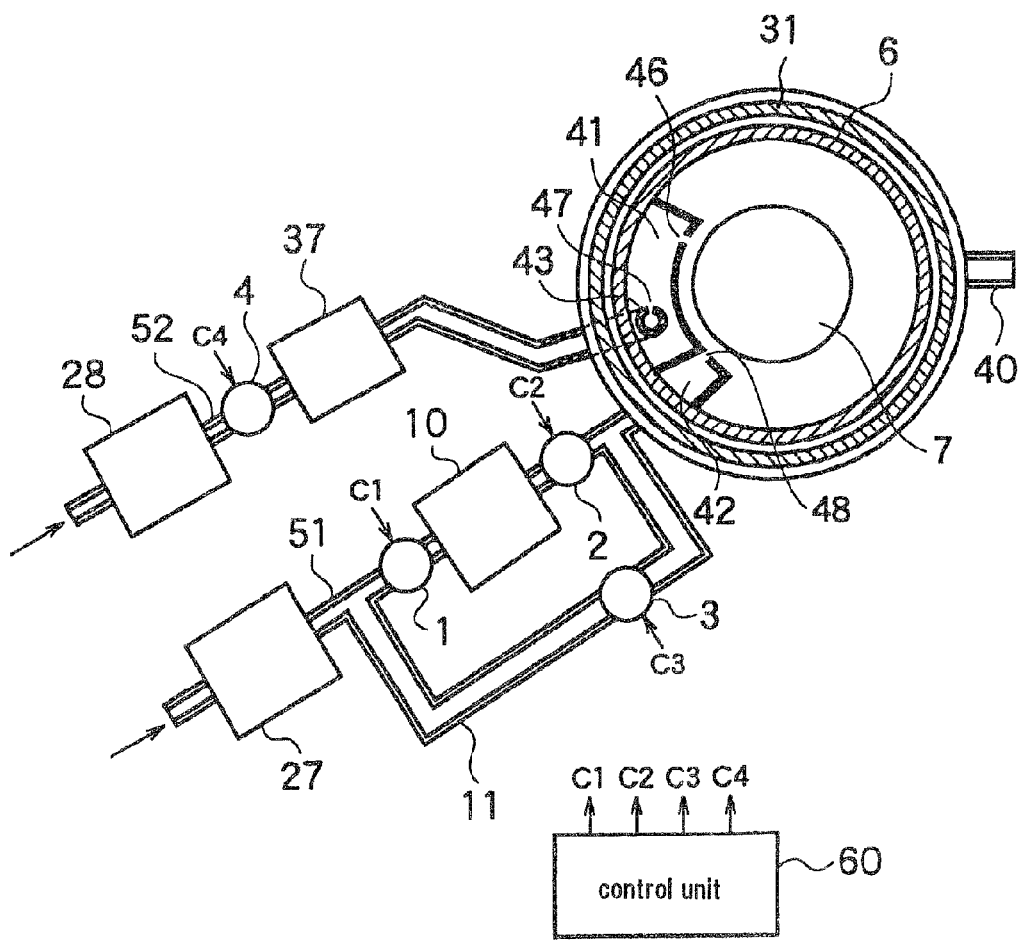
FIG. 1 is a schematic traverse sectional view showing one example of a reaction tube of a substrate processing apparatus according to the present invention.
Figure 2:
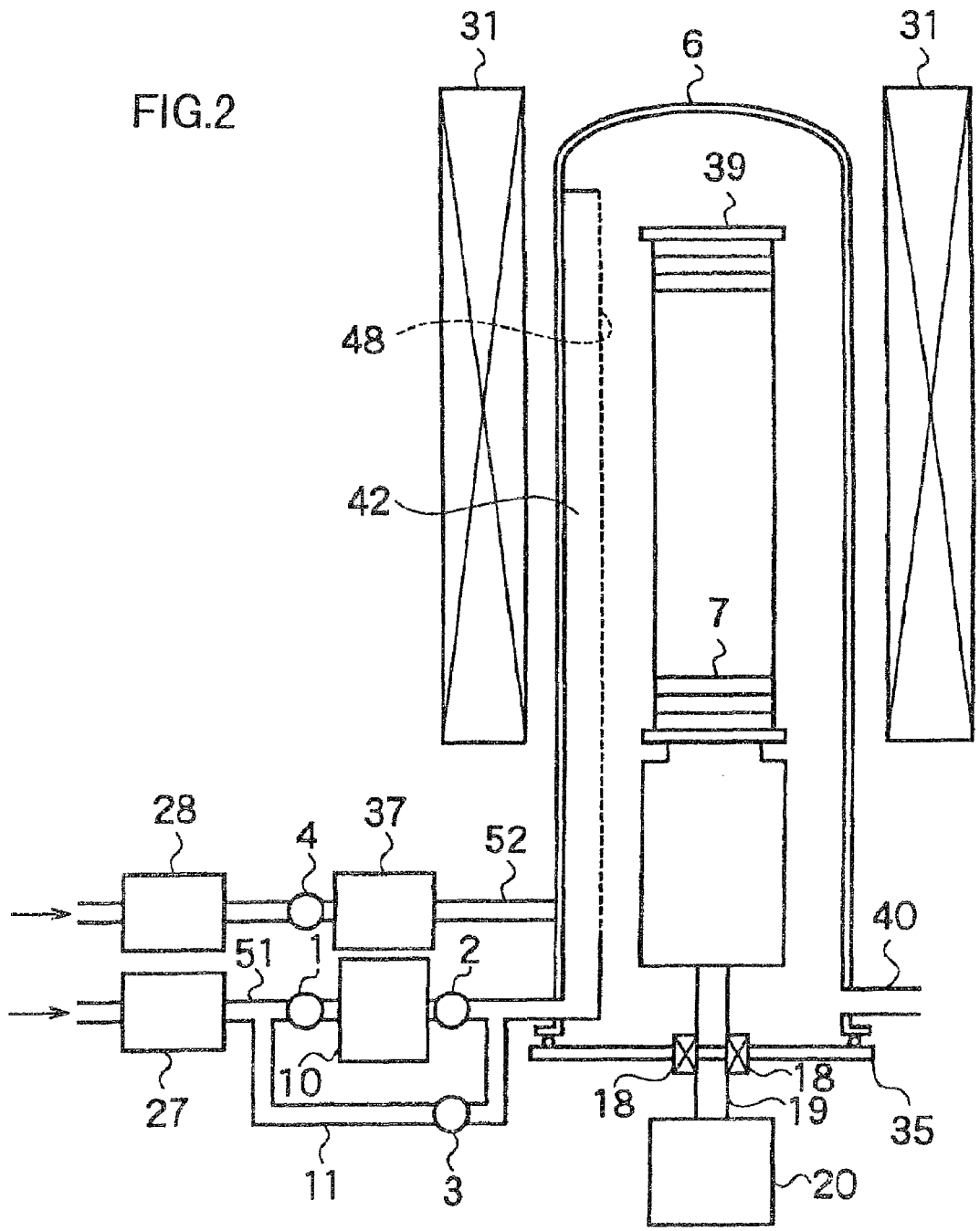
FIG. 2 is a schematic vertical sectional view showing the example of the reaction tube of the substrate processing apparatus of the invention.
Figure 6:
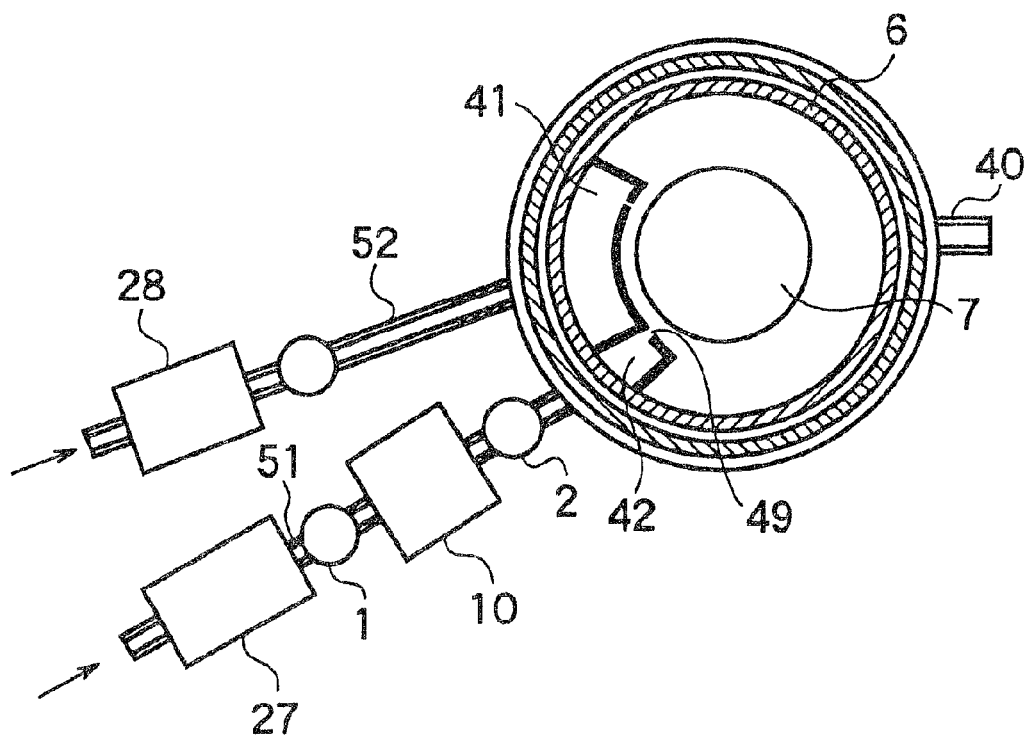
FIG. 6 is a schematic transverse sectional view showing one example of a reaction tube of a previously proposed substrate processing apparatus.

FIGS. 1 and 2 show one example of a vertical substrate processing apparatus according to the embodiment. A basic structure of the vertical substrate processing apparatus will be explained using FIGS. 1 and 2. In the explanation, structures of a gas reservoir 10 and a bypass pipe 11 which are added to a basic structure are omitted.

As shown in FIGS. 1 and 2, a quartz reaction tube 6 is provided inside of a heater 31. The reaction tube 6 constitutes a reaction chamber which processes wafers (substrates) 7 to be processed. A diameter of the substrate 7 is 200 mm. A lower end opening of the reaction tube 6 is air-tightly closed with a seal cap 35. A boat 39 is provided in a standing attitude above the seal cap 35 and is inserted into the reaction tube 6. The boat 39 is connected to a rotation mechanism 20 through a rotation shaft 19 which is rotatably supported by a bearing 18. To enhance the consistency of the processing, the boat 39 (substrates 7) is arranged such that the boat 39 can rotate. The plurality of substrates 7 to be batch-processed are placed in the boat 39 in a multi-stacked manner in their horizontal postures in an axial direction of the reaction tube 6. The heater 31 heats the substrates 7 in the reaction tube 6 to a predetermined temperature.

Two gas supply pipes are provided in the reaction tube 6. The gas supply pipes function as supply paths for supplying a plurality of kinds of gases (here, two kinds of gases). The first gas supply pipe 51 is connected to one side of the reaction tube 6 without through a remote plasma unit. The second gas supply pipe 52 is connected to the one side of the reaction tube 6 through a remote plasma unit 37. Thus, there are two kinds of gases are supplied to the substrates 7 in the reaction tube 6, i.e., gas which is not excited with plasma and is supplied, and gas which is excited with plasma and is supplied as active species. The first supply pipe 51 and the second supply pipe 52 are respectively provided with MFCs 27 and 28 so that flow rates of gases flowing into the first supply pipe 51 and the second supply pipe 52 are controlled. A gas exhaust pipe 40 as an exhaust path for exhausting gas from the reaction tube 6 is connected to the other side of the reaction tube 6. A vacuum pump as vacuum exhaust means (not shown) is connected to the gas exhaust pipe 40.

A remote plasma unit 37 is connected to a nozzle 43 which stands in a second buffer chamber 41 in the reaction tube 6 along the boat 39.

The second buffer chamber 41 is formed in an arc shape in a space between an inner wall of the reaction tube 6 and the substrate 7 along the inner wall of the reaction tube 6 in the illustrated example. The second buffer chamber 41 extends along the inner wall of the reaction tube 6 and provided along the stacking direction of the substrates 7 from a lower portion to an upper portion of the inner wall of the reaction tube 6. An end of a wall of the second buffer chamber 41 which is adjacent to the substrate 7 is provided with second buffer chamber holes 46 as gas supply ports. The second buffer chamber holes 46 open toward a center of the reaction tube 6 (substrates 7).

A nozzle 43 connected to the remote plasma unit 37 is disposed in the second buffer chamber 41 on an end of the second buffer chamber 41 opposite from the end provided with the second buffer chamber holes 46. The nozzle 43 extends along the stacking direction of the substrate 7 from the lower portion to the upper portion of the reaction tube 6. The nozzle 43 is provided with a plurality of nozzle holes 47.

The nozzle 43 and the second buffer chamber 41 are respectively provided with the nozzle holes 47 and the second buffer chamber holes 46. The opening states of the holes will be explained using FIGS. 3A and 3B.

FIG. 3A is a perspective view of the nozzle shown in FIG. 1. FIG. 3B is a perspective view of the second buffer chamber 41 shown in FIG. 1 also.

The nozzle 43 shown in FIG. 3A is a pipe having a circular cross section. The nozzle holes 47 are straightly formed in a side surface of the nozzle 43 from a substantially uppermost portion of the nozzle 43 to a location corresponding to a bottom of the second buffer chamber 41 such that the nozzle holes 47 are arranged from an upstream side toward a downstream side of gas flow. Opening areas of the nozzle holes 47 are formed such that the opening areas are increased from the upstream side (downward in FIGS. 3A and 3B) as viewed from the second supply pipe 52 toward the downstream side (upward in FIGS. 3A and 3B), the conductance is varied so that gas can issue equally in any of upstream side and downstream side.

The second buffer chamber 41 shown in FIG. 3B is a pipe having an arc cross section. The second buffer chamber holes 46 having the same opening areas are formed in an end of an inner curved surface of the second buffer chamber 41 such that the second buffer chamber holes 46 are straightly arranged in the stacking direction of the substrates 7.

As shown in FIGS. 1 and 2, the inner wall of the reaction tube 6 is provided with a first buffer chamber 42 which is adjacent to the second buffer chamber 41. A first supply pipe 51 is connected to a lower portion of the first buffer chamber 42. Like the second buffer chamber 41, the first buffer chamber 42 also has first buffer chamber holes 48 formed at the same pitch at locations adjacent to the substrates 7. The first buffer chamber 42 is provided at its lower portion with a reaction gas introducing port. The first buffer chamber holes 48 are formed such that opening areas thereof are increased from the upstream side toward the downstream side so that gas can issue equally in any of upstream side and downstream side.

There is provided a control unit 60 which controls a flowing manner of two kinds of gases and controls film forming temperature of the substrate 7. The control unit 60 has a gas supply control function for controlling such as to allow the two kinds of gases to flow alternately one kind by one kind. The control unit 60 also has a temperature control function for controlling film forming temperature by heating using a heater.

A method for forming a film using the vertical ALD apparatus having the above-described basic structure will be explained. Here, an $Si_3N_4$ film is formed. The reaction gas is DCS ($SiH_2Cl_2$: dichlorsilane), and $NH_3$ active species activated with plasma.

First, substrates 7 on which films are to be formed are mounted on the boat 39 and brought into the reaction tube 6 (also simply called furnace, hereinafter). Then, $Si_3N_4$ films are formed. The temperature in the reaction tube 6 at that time is set to such a value that a film having excellent adhesion with respect to the ground film and little defect of interface is formed, e.g., 350 to 600° C. For forming the film, the ALD method in which $NH_3$ and DCS are alternately allowed to flow to form a film one atom layer by one atom layer is used.

First, $NH_3$ is supplied from the second supply pipe 52. Since the $NH_3$ has higher reaction temperature than that of the DCS, $NH_3$ does not react at the temperature in the reaction tube 6. Thus, the $NH_3$ is excited with plasma using the remote plasma unit 37 to activate the same and $NH_3$ is allowed to flow as active species so that the $NH_3$ reacts even at the temperature in the reaction tube 6. At that time, the pressure in the reaction tube 6 is maintained at relatively low pressure of 40 to 60 Pa, the $NH_3$ excited with plasma and brought into the active species is supplied for 5 to 120 seconds. Here, gas flowing into the reaction tube 6 is only $NH_3$ which was excited with plasma and brought into active species, and no DCS exists. Thus, $NH_3$ which was excited with plasma and brought into active species does not vapor phase reacts, and adsorbs on the ground film on the substrate 7.

The nozzle holes 47 formed in the nozzle 43 is formed such that their opening areas are gradually increased from the upstream side toward the downstream side of the gas flow so that the flow rate of $NH_3$ issuing into the second buffer chamber 41 is equalized.

Therefore, the flow speed of $NH_3$ passing through the nozzle holes 47 and issuing into the second buffer chamber 41 is high on the upstream side and low on the downstream side, but the flow rates are all the same between all of the nozzle holes 47.

The $NH_3$ issuing into the second buffer chamber 41 is once introduced there, and the pressure in the second buffer chamber 41 is equalized.

As described above, since all of the opening areas of the second buffer chamber holes 46 are the same, active species of $NH_3$ supplied to the substrates 7 are supplied with equal flow rate and at equal flow speed. Therefore, uniform film forming processing is carried out for each of the substrates 7.

Further, the second buffer chamber holes 46 are provided such that each of the holes is located at a location corresponding to a middle of a distance between substrates 7 which are placed in the multi-stacked manner. Thus, $NH_3$ which is processing gas is sufficiently supplied to each of the stacked substrates 7.

Next, DCS is supplied from the first supply pipe 51. Since the DCS reacts at the temperature in the reaction tube 6, it is unnecessary to excite with plasma using the remote plasma unit 37. The pressure in the reaction tube 6 at that time is increased to 266 to 931 Pa which is higher than that when $NH_3$ is supplied. If DCS is supplied, $NH_3$ on the ground film and DCS surface reacts with each other and the $Si_3N_4$ film is formed.

The first buffer chamber 42 is formed with the first buffer chamber holes 48 whose opening areas are gradually increased from the upstream side toward the downstream side of gas flow. The first buffer chamber holes 48 is provided toward the center of the reaction tube 6 (substrates 7). As a result, flow rate of DCS supplied from the first buffer chamber holes 48 toward the substrates 7 is the same although the flow speed is different, and the DCS issues into the reaction tube 6.

It is preferable that one more set of the nozzle 43 and the second buffer chamber 41 which are the same as those used for supplying $NH_3$ is disposed in the reaction tube 6 instead of the first buffer chamber 42, and DCS is supplied from the second buffer chamber holes 46 because both the flow rate and flow speed can be equalized.

In this embodiment, if the flow rate of DCS gas is equalized using the first buffer chamber 42 which is simpler than the combination of the nozzle 43 and the second buffer chamber 41, sufficiently uniform film forming processing can be carried out for the substrates 7.

The step for alternately flowing $NH_3$ and DCS is defined as one cycle. An $Si_3N_4$ film having predetermined thickness is formed by repeating this cycle. According to the ALD method, since two kinds of gases which contribute to the film formation do not exist in the vapor phase at a time, gas adsorbs the ground surface and reacts with the ground film. Therefore, a film having excellent with respect to the ground film can be obtained, and defect in interface is reduced as compared with the CVD (Chemical Vapor Deposition) method in which two kinds of gases are allowed to flow at a time. Further, of the plurality of kinds of gases, $NH_3$ which is required to be excited with plasma is excited with plasma and brought into the active species and allowed to flow. Therefore, a film can be formed at the reaction temperature by means of DCS gas which need not be excited with plasma and thus, the film can be formed at temperature as low as 350 to 600° C.

In addition to this basic structure, in the substrate processing apparatus of this embodiment, the gas reservoir 10 for storing gas is provided downstream (between the MFC 27 and the reaction tube 6) from the MFC 27 of the first supply pipe 51. The gas reservoir 10 comprises a gas tank or a spiral pipe having greater gas capacity than a normal pipe for example.

A bypass pipe 11 is connected to the first supply pipe 51 downstream from the MFC 27. The bypass pipe 11 bypasses the gas reservoir 10.

The first supply pipe 51 is provided at its upstream side in the vicinity of the gas reservoir 10 with a first valve 1 which opens and closes a pipe path, and at its downstream with a second valve 2 which opens and closes the pipe path. The bypass pipe 11 is provided with a third valve 3 which opens and closes a pipe path.

By opening and closing the first, second and third valves 1, 2 an 3, it is possible to store DCS gas as first kind of gas in the gas reservoir 10, to supply the stored DCS gas to the reaction tube 6, and to supply DCS gas to the reaction tube 6 through the bypass pipe 11 without using the gas reservoir 10.

The second supply pipe 52 is provided at its upstream side in the vicinity of the remote plasma unit 37 with a fourth valve 4 which opens and closes a pipe path so that if the fourth valve 4 is opened and closed, $NH_3$ gas as second kind of gas can be supplied to the reaction tube 6 or the supply of the gas can be stopped. The gas exhaust pipe 40 is provided with an exhaust valve (not shown) which adjusts the opening and closing operations and an opening degree of the pipe path. Gas can be exhausted from the reaction tube 6 or the exhausting operation can be stopped by opening and closing the exhaust valve. Gas can be exhausted from the reaction tube 6 while maintaining predetermined pressure in the reaction tube 6 by adjusting the opening degree of the exhaust valve. The exhaust valve may be a single valve having a function for opening and closing and a function for adjusting the opening degree, or may comprise a plurality of valves including a valve having the opening and closing function and a valve having the opening degree-adjusting function.

Further, there is provided the control unit 60 which controls the first, second, third and fourth valves 1, 2, 3 and 4, as well as the heater 31. The control unit 60 controls the exhaust valve and the first, second and third valves 1, 2 and 3 to allow DCS gas to flow into the first supply pipe 51 and store the gas in the gas reservoir 10, and DCS gas stored in the gas reservoir 10 is supplied to the reaction tube 6 or DCS gas is supplied to the reaction tube 6 through the bypass pipe 11 without using the gas reservoir 10 in a state in which exhaust operation of the reaction tube 6 is stopped or the exhaust operation is carried out. With this, the pressure in the reaction tube 6 is increased and the substrate 7 is exposed to DCS gas. Further, by supplying $NH_3$ gas into the reaction tube 6 from the second supply pipe 52 through the remote plasma unit 37 while exhausting gas from the reaction tube 6, the substrate 7 is exposed to active species obtained by exciting $NH_3$ gas with plasma.

Next, one example of film forming sequence using the gas reservoir 10 will be explained.

A case in which DCS and $NH_3$ are used as the raw material gases will be explained. In this example, a gas supply pipe 52 (line) for $NH_3$ does not have the gas reservoir 10, and DCS is supplied using a gas supply pipe 51 (line) having the gas reservoir 10. Although the raw material gas is first allowed to flow into the reaction tube 6 using a pipe having no gas reservoir 10 in the following example, a method in which raw material gas is first are allowed to flow using a pipe having the gas reservoir 10 can also be employed similarly.

First, a substrate 7 on which a film is to be formed is mounted in the boat 39 and transferred into the reaction tube 6. After the substrate 7 is transferred, the following operations (1) to (4) are defined as one cycle, and this cycle is repeatedly carried out.

$NH_3$ gas which need to be excited with plasma and DCS gas which need not be excited with plasma are allowed to flow together. First, the fourth valve 4 provided in the second supply pipe 52 and the exhaust valve provided in the gas exhaust pipe 40 are both opened, $NH_3$ is excited with plasma by the remote plasma unit 37 and brought into active species and passes through the second buffer chamber 41 from the second supply pipe 52, $NH_3$ is supplied to the substrates 7 from the second buffer chamber holes 46 formed for respective substrates 7 and arrange at the same distances from one another as distances between the substrates 7 provided in the second buffer chamber 41 and in this state, $NH_3$ is exhausted from the gas exhaust pipe 40.

When $NH_3$ is excited with plasma and allowed to flow as active species, the exhausting operation from the gas exhaust pipe 40 is appropriately adjusted and the pressure in the reaction tube 6 is set to 10 to 100 Pa. A supply flow rate of $NH_3$ to be controlled by the MFC 28 is in a range of 100 to 10000 sccm. Time during which the substrate 7 is exposed to the active species obtained by exciting $NH_3$ with plasma is 2 to 60 seconds. The temperature in the reaction tube 6 is set to 300 to 600° C. Since the reaction temperature of $NH_3$ is high, $NH_3$ does not react at the temperature in the reaction tube 6, but since $NH_3$ is excited with plasma and brought into active species and then is allowed to flow, $NH_3$ can react even if the temperature in the reaction tube 6 is maintained in the preset low temperature range.

When $NH_3$ is excited with plasma and brought into active species and supplied, the first valve 1 on the upstream side of the first supply pipe 51 is opened, the second valve 2 on the downstream side is closed, and DCS is also allowed to flow. With this, if DCS is supplied to the gas reservoir 10 provided between the valves 1 and 2 and a predetermined amount of DCS is stored in the gas reservoir 10 under the predetermined pressure, the first valve 1 is also closed to confine DCS in the gas reservoir 10. DCS is stored in the gas reservoir 10 such that the pressure therein becomes 20000 Pa or higher. A pipe system is constituted such that conductance between the gas reservoir 10 and the reaction tube 6 becomes $1.5 \times 10^{-3}$ m$^3$/s or higher. If a ratio of a reaction tube capacity and a capacity of the gas reservoir 10 required for the former capacity is taken into consideration, it is preferable that the gas reservoir capacity is in a range of 100 to 300 cc when the reaction tube capacity is 100 l (100 liters), and the gas reservoir 10 has capacity of 1/1000 to 3/1000 times of the reaction tube capacity as a capacity ratio.

Gas flowing into the reaction tube 6 is active species obtained by exciting $NH_3$ with plasma, and there exists no DCS. Thus, $NH_3$ does not vapor phase reacts, and $NH_3$ which was excited with plasma and brought into active species adsorbs to the ground film on the substrate 7.

$NH_3$ supplied from the nozzle 43 to the second buffer chamber 41 is supplied to the substrates 7 from the second buffer chamber holes 46 which are formed for respective substrates 7 and arrange at the same distances from one another as distances between the substrates 7.

The fourth valve 4 is closed to stop the flow of $NH_3$ into the reaction tube 6.

Next, remaining $NH_3$ is removed from the reaction tube 6 and from the second buffer chamber 41, gas is exhausted from the reaction tube 6 by vacuum exhaust means to 20 Pa or lower, and remaining $NH_3$ is removed from the reaction tube 6. At that time, a line of inert gas may be added between the second buffer chamber 41 and the remote plasma unit 37 and combination of purge and evacuation using inert gas is effective for gas replacement.

The second valve 2 located downstream from the gas reservoir 10 is opened. With this, DCS stored in the gas reservoir 10 supplied at a dash to the substrates 7 from the first buffer holes 48 which are formed for respective substrates 7 and arrange at the same distances from one another as distances between the substrates 7 through the first buffer chamber 42. The adjusting means of the pressure in the reaction tube 6 sets such that the pressure is increased so that the partial pressure of DCS is increased to promote the reaction with the $NH_3$.

For example, the pressure in the reaction tube 6 is abruptly increased by the supply of DCS to about 266 to 931 Pa which is higher that of the case of $NH_3$. The supply flow rate of DCS is 100 to 2000 cc. Time during which DCS was supplied is set to 2 to 4 seconds, time during which the substrate was exposed to the increased pressure atmosphere is set to 2 to 4 seconds, and the total time was set to 6 seconds. The temperature in the reaction tube 6 is the same as that when $NH_3$ is supplied, and is 300 to 600° C. $NH_3$ on the ground film and DCS are reacted with each other by supplying DCS, and an $Si_3N_4$ film is formed on the substrate 7.

The second valve 2 is closed to stop the supply of DCS from the gas reservoir 10. After the second valve 2 is closed, time elapsed until the next supply starts can be used as DCS storing time (that is, it is unnecessary to spend time wastefully only for storing time action while another operation is being carried out, and the first valve 1 is opened to star the supply of DCS to the gas reservoir 10).

Next, remaining DCS is removed from the first buffer chamber 42, gas is exhausted by the vacuum exhaust means, and gas of the remaining DCS after it contributed to film formation is removed from the reaction tube 6. At that time, a line of inert gas may be added between the first buffer chamber 42 and the second valve 2 and combination of purge and evacuation using inert gas is effective for gas replacement.

These operations (1) to (4) are defined as one cycle, and this cycle is repeatedly carried out. With this, an $Si_3N_4$ film having predetermined film thickness can be formed on the substrate 7.

In this sequence, the boat 39 on which the substrates 7 are placed is rotated at a constant speed. With this, even if gas is supplied to the substrates 7 from one direction (along the radial direction of the substrates and along the surfaces of the substrates), the entire surfaces of the substrates 7 are subjected to film forming processing more uniformly. That is, the consistency of film thickness within the surface of the substrate is enhanced. In this embodiment, the rotation speed of the substrate 7 is about 14 to 30 seconds in the one cycle, but it is preferable that the rotation speed is set to about 10 seconds in terms of throughput.

If the substrate 7 is rotated once during one rotation, the position of the substrate 7 is the same every time when raw material gas, e.g. DCS is supplied. That is, the substrate 7 is rotated but when DCS is supplied from the first buffer chamber holes 48, gas is supplied from one peripheral edge of the substrate 7 toward the substrate 7. If gas is supplied in this manner, since the gas reservoir 10 is used, the supply speed of gas is fast. Therefore, as shown in FIGS. 5A and 5B, there is a tendency that an end 65 of the substrate closer to the first buffer chamber holes 48 (gas supply ports) having narrow width is thickened in film thickness.

For this reason, it is preferable that the rotation speed and gas supply timing are finely adjusted so that the same positions of the substrates 7 are not located closer to the first buffer chamber holes 48. For example, as shown in FIG. 4, this fine adjustment is carried out in such a manner that the rotation speed is increased or decreased such that gas is supplied so that the gas supply position P is deviated through 45° each cycle, or the rotation speed is set constant and the gas supply timing is staggered. With this fine adjustment, a state in which only one portion of the substrate 7 is kept opposing to the first buffer chamber hole 48 is avoided, a locally thickened portion can be dispersed, and the consistency can be enhanced.

This fine adjustment is effective when a thick film requiring alternative supply of 60 cycles or more is to be formed, but when a thin film of less than 60 cycles is to be formed, although it is possible to avoid the case in which only one portion of the substrate 7 is not opposed to the first buffer chamber hole 48 depending upon the combination of the rotation speed and the gas supply timing, since the rotation number is small, there is an adverse possibility that the degree of dispersion is low and the periphery becomes uneven. As the rotation number is smaller, i.e., as the film thickness formed on the substrate is thinner, the possibility of deterioration of consistency due to unevenness becomes higher. Here, the films are divided into thick films and thin films on the basis of 60 cycles, but this numerical value is only an example and the invention is not limited to this. For example, when a film of about 1 Å thickness is formed in one cycle, the thickness becomes 60 Å in 60 cycles. Generally, a film of 100 Å or less thickness is called a thin film, and a film of 1000 Å or more is called a thick film.

When a film of less than 60 cycles is to be formed, raw material gas, in this embodiment DCS is supplied using the bypass pipe 11 without using the gas reservoir 10. If DCS is supplied using the bypass pipe 11, the gas supply speed to the substrate 7 is as slow as ⅓ of a case in which gas is supplied using the gas reservoir 10. Since gas is supplied while taking relatively long time, gas is dispersed, gas is not concentrated on only a narrow portion of the rotating substrate 7, and gas is dispersed in a wide range. Thus, the adverse possibility of unevenness is eliminated, and even when a thin film is to be formed, the consistency within a surface of the substrate 7 can be enhanced.

Therefore, in the substrate processing apparatus of this embodiment, when a thin film is to be formed, gas is not stored in the gas reservoir 10 and supplied, but the bypass pipe 11 capable of supplying gas to the reaction tube 6 through the mass flow controller 27 for desired time is provided. When a thin film of 60 Å or less thickness is to be formed, the bypass pipe 11 is used, and when a film having greater thickness than 60 Å is to be formed, the gas reservoir 10 is used. If the supply paths are properly selected, it is possible to form having excellent consistency of thickness in both thin and thick films.

When a thin film is to be formed, since the number of alternative supplies (the number of cycles) is small. Although pressure-rising time of several seconds per one cycle is additionally required, the total time is not increased so much.

It is conceived that the first and second valves 1 and 2 are kept opened without using the gas reservoir 10 as a tank, and the gas reservoir 10 is used as a path of gas, i.e., as a pipe. A film was formed using the gas reservoir 10 as a pipe, the consistency of film thickness and film thickness reproducibility were inferior as compared with a case in which the bypass pipe 11 was used. It is believed that this is because gas is accumulated in the gas reservoir 10, stagnation is generated and this can not be removed even by the subsequent exhausting operation, and the gas vapor phase reacted with subsequent gas. This deterioration was overcome by sufficiently increasing the exhausting operation time after the gas supply. However, this is not preferable because the exhausting operation time is increased in addition to the additional supply time of several seconds per one cycle, and the film forming time is increased. Thus, it is effective to provide the bypass pipe 11.

In this embodiment, while DCS is stored in the gas reservoir 10, $NH_3$ is excited with plasma and brought into active species and supplied and gas is exhausted from the reaction tube 6 which are necessary steps for the ALD method. Thus, a special step for storing DCS is not required. Further, since DCS is allowed to flow after gas is exhausted from the reaction tube 6, $NH_3$ and DCS do not react on the way to the substrate 7. The supplied DCS can effectively react with only $NH_3$ adsorbing to the substrate 7.

In the above-described embodiment, one gas tank or one spiral pipe is provided as the gas reservoir 10. The present invention is not limited to this, and a plurality of gas reservoirs may be provided juxtaposed to one another. The gas reservoir 10 of this invention is not limited to the gas tank or spiral pipe, and the gas reservoir may be any means only if it can store gas and discharge gas at a dash. For example, the gas supply pipe of DCS may be thicker than a normal pipe and the MFC capacity may be increased correspondingly. The number of the gas supply pipes may be two or more. In this case, the number of cylinders which function as DCS supply sources may be increased in accordance with the number of gas supply pipes. Further, since the vapor pressure of DCS is low, the cylinder may be heated to increase the amount of vaporization of DCS. Further, DCS may forcibly be sent into the reaction tube 6 by a pump.

The present invention is applied to the vertical substrate processing apparatus in this embodiment, but the invention can also be applied to a producing method of a semiconductor device. In the producing method of semiconductor device, gas is exhausted from the reaction chamber (reaction tube), processing gas is supplied to the reaction chamber, and a substrate in the reaction chamber is processed. The processing gas is stored in a portion of a supply path through which the processing gas flows, the processing gas stored in the portion of the supply path is supplied to the reaction chamber, or the processing gas is supplied to the reaction chamber without storing the processing gas in the portion of the supply path, and a film is formed on the substrate. According to this method, when a thin film is to be formed, the processing gas is supplied to the reaction chamber at a normal supply speed without storing the processing gas in the portion of the supply path and the processing gas can sufficiently be dispersed over the substrate and thus, the thickness of the formed film is equalized within its surface. Thus, when a thin film is to be formed, since gas is supplied to the reaction chamber without storing the gas, a film having the constant thickness can be formed even if its thickness is thin.

Although DCS and $NH_3$ requiring the remote plasma unit are used as reaction gases in the above embodiment, the present invention is not limited to this, and gas which does not require the remote plasma unit can also be used. For example, when an $Si_3N_4$ film is to be formed using HCD ($Si_2Cl_6$) and $NH_3$, gas reservoirs can be used for both the gas supply pipes and thus, a bypass line is also provided for each of them. When an $Al_2O_3$ film is to be used using $Al(CH_3)_3$ and ozone $O_3$, $Al(CH_3)_3$ is stored in the gas reservoir and $O_3$ is supplied from an ozone generator.

INDUSTRIAL APPLICABILITY

According to this invention, as described above, gas is supplied using the bypass line disposed juxtaposed to the gas reservoir, even a thin film has excellent thickness consistency, and a film having excellent consistency can be obtained irrespective of its thickness.

As a result, the present invention can preferably be utilized for a substrate film-forming apparatus using the ALD method.

The invention claimed is:

1. A film-forming method comprising:
providing a substrate to be film-formed in a reaction chamber of an apparatus comprising: the reaction chamber; a first gas supply pipe in fluid communication with the reaction chamber for carrying a first processing gas to the reaction chamber; a second gas supply pipe in fluid communication with the reaction chamber for carrying a second processing gas to the reaction chamber; a gas reservoir in fluid communication with the first gas supply pipe; and a bypass line in fluid communication with the first gas supply pipe, the bypass line bypassing the gas reservoir by directing the first processing gas to the reaction chamber without passing through the gas reservoir; and
alternately supplying the first processing gas and the second processing gas into the reaction chamber a plurality of times to form a film on the substrate, wherein;
when the first processing gas is supplied, the gas reservoir or the bypass line is selected to supply the first processing gas into the reaction chamber through the first gas supply pipe, and when the second processing gas is supplied the second processing gas is supplied through the second gas supply pipe.

2. A film-forming method as recited in claim 1, wherein the first gas is supplied into the reaction chamber in a state in which the first gas is not excited with plasma, and the second gas supplied to the reaction chamber in a state in which the second gas is excited with plasma.

3. A film-forming method as recited in claim 1, wherein when the first gas is supplied into the reaction chamber using the gas reservoir, the first gas is stored in the reservoir while the second gas is supplied into the reaction chamber.

4. A film-forming method as recited in claim 1, wherein a pressure in the reaction chamber when the first gas is supplied into the reaction chamber is set higher than a pressure in the reaction chamber when the second gas is supplied to the reaction chamber.

5. A film-forming method comprising:
providing a substrate to be film-formed in a reaction chamber of an apparatus comprising: the reaction chamber; a first gas supply pipe in fluid communication with the reaction chamber for carrying a first processing gas to the reaction chamber; a second gas supply pipe in fluid communication with the reaction chamber for carrying a second processing gas to the reaction chamber; a gas reservoir in fluid communication with the gas supply pipe; a bypass line in fluid communication with the first gas supply pipe, the bypass line bypassing the gas reservoir; a gas supply member disposed in the reaction chamber to supply the first processing gas to the substrate from a periphery of the substrate, the gas supply member being in fluid communication with the first gas supply pipe; and a rotating member to rotate the substrate, and
alternately supplying the first processing gas and the second processing gas into the reaction chamber a plurality of times, with the substrate being rotated by the rotating member;
during the supply of the first processing gas and the supply of the second processing gas to the substrate to form a film on the substrate,
wherein when the first gas is supplied, the gas reservoir or the bypass line is selected to supply the first gas into the reaction chamber through the first gas supply pipe and the first gas is supplied from the periphery of the substrate to the substrate through the gas supply member, and when the second gas is supplied the second gas is supplied through the second gas supply pipe.

6. A film-forming method as recited in claim 5, wherein the first gas is supplied into the reaction chamber in a state in which the first gas is not excited with plasma, and the second gas supplied to the reaction chamber in a state in which the second gas is excited with plasma.

7. A film-forming method as recited in claim 5, wherein when the first gas is supplied into the reaction chamber using the gas reservoir, the first gas is stored in the reservoir while the second gas is supplied into the reaction chamber.

8. A film-forming method as recited in claim 5, wherein a pressure in the reaction chamber when the first gas is supplied into the reaction chamber is set higher than a pressure in the reaction chamber when the second gas is supplied to the reaction chamber.

9. A film-forming method as recited in claim 5, wherein when a thickness of the film to be formed is about 1000 A or more, the first gas is supplied using the gas reservoir, and when a thickness of the film to be formed is 100 A or less, the first gas is supplied using the bypass line.

10. A film-forming method as recited in claim 5, wherein if a time from when the first processing gas is started to supplied into the reaction chamber to when the first processing gas is started to supplied into the reaction chamber next is defined as one cycle, when the number of the cycles is 60 cycles or more to form the film, the first gas is supplied using the gas reservoir, and when the number of the cycles is less than 60 cycles to form the film, the first gas is supplied using the bypass line.

11. A film-forming method as recited in claim 5, wherein if a time from when the first processing gas is started to supplied into the reaction chamber to when the first processing gas is started to supplied to the reaction chamber next is defined as one cycle, the time of the one cycle is different from a time for the substrate to be rotated one turn.

* * * * *

UNITED STATES PATENT AND TRADEMARK OFFICE
CERTIFICATE OF CORRECTION

PATENT NO. : 7,713,582 B2                                                                                    Page 1 of 1
APPLICATION NO. : 12/039686
DATED            : May 11, 2010
INVENTOR(S)      : Masanori Sakai et al.

It is certified that error appears in the above-identified patent and that said Letters Patent is hereby corrected as shown below:

On the Title Page:

Item (62), Related U.S. Application Data, should read as follows:

-- Division of application No. 10/530,527, filed as application No. PCT/JP2003/012786 on Oct. 6, 2003, now abandoned. --.

Insert the following as Item (30):

-- (30) Foreign Application Priority Data
   Oct. 8, 2002    (JP)    ............... 2002-295323 --.

Signed and Sealed this

Nineteenth Day of October, 2010

David J. Kappos
*Director of the United States Patent and Trademark Office*